United States Patent
Higashida et al.

(10) Patent No.: US 8,254,075 B2
(45) Date of Patent: Aug. 28, 2012

(54) SEMICONDUCTOR DEVICE AND CIRCUIT PROTECTION METHOD

(75) Inventors: Yoshihiro Higashida, Kanagawa (JP); Akio Tamagawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 174 days.

(21) Appl. No.: 12/877,375

(22) Filed: Sep. 8, 2010

(65) Prior Publication Data
US 2011/0058297 A1    Mar. 10, 2011

(30) Foreign Application Priority Data
Sep. 9, 2009 (JP) .................... 2009-208105

(51) Int. Cl.
*H02H 5/04* (2006.01)
(52) U.S. Cl. ....................... 361/93.9; 361/103
(58) Field of Classification Search ........ 361/93.7–93.9, 361/103, 106
See application file for complete search history.

(56) References Cited

U.S. PATENT DOCUMENTS
6,987,655 B2 * 1/2006 Kesler et al. ............ 361/103
2009/0046405 A1 * 2/2009 Ichikawa ............... 361/103

FOREIGN PATENT DOCUMENTS
| JP | 11-34765 A | 5/1989 |
| JP | 2000-299631 A | 10/2000 |
| JP | 2001-257573 A | 9/2001 |
| JP | 2003-297929 A | 10/2003 |

* cited by examiner

*Primary Examiner* — Danny Nguyen
(74) *Attorney, Agent, or Firm* — Sughrue Mion, PLLC

(57) ABSTRACT

A semiconductor device includes a current supply section configured to control a current flowing through a load circuit; an overcurrent detecting section configured to detect based on the current, that an overcurrent flows through the load circuit, to output an overcurrent signal; and an overheat detecting circuit configured to detect that a peripheral temperature exceeds a detected temperature, in response to the overcurrent signal, and output an overheat detection signal. The overheat detecting circuit has a hysteresis to the detection temperature, and the detection temperature contains an overheat detection temperature used to detect an overheat state and a recovery temperature used to detect to have escaped from the overheat state. The semiconductor device further includes a drive control circuit configured to output the current control signal which indicates the quantity of the current flowing through the load circuit based on the overcurrent signal and the overheat detection signal in the electric current supply section.

17 Claims, 8 Drawing Sheets

SEMICONDUCTOR DEVICE AND CIRCUIT PROTECTION METHOD

INCORPORATION BY REFERENCE

This patent application claims a priority on convention based on Japanese Patent Application No. 2009-209105 filed on Sep. 9, 2009. The disclosure thereof is incorporated herein by reference.

TECHNICAL FIELD

The present invention relates to a semiconductor device, and especially relates to a semiconductor device and a circuit protecting method for detecting an overheat state to protect a circuit.

BACKGROUND ART

Conventionally, a relay is often used to control a large current and a high voltage. However, in an engine control unit (ECU) for automobile electric components, an IPD (Intelligent Power Device) has been increasingly used instead of the relay in these years. The IPD is provided with a circuit having a protection function around a power MOS transistor, and has a built-in self-diagnosis function. The IPD is able to transmit a self-diagnosis result to a control microprocessor.

For example, as disclosed in Patent Literature 1 (JP 2000-299631A), a power supply control apparatus is known which corrects a detection result of a current detecting circuit on the basis of a detection result of a temperature detecting circuit. The power supply control apparatus includes a semiconductor switch, a temperature detecting circuit, a current detecting circuit, and a control circuit. The semiconductor switch is switched in accordance with a control signal supplied to a control signal input terminal, and controls a power supply from a power supply to a load. The temperature detecting circuit detects a temperature of the semiconductor switch. The current detecting circuit detects a current flowing through the semiconductor switch on the basis of a voltage generated due to an on resistance of the semiconductor switch. The control circuit corrects a detection result by the current detecting circuit on the basis of the detection result of the temperature detecting circuit, and controls the supply of the control signal on the basis of the corrected detection current.

In addition, in Patent Literature 2 (JP 2001-257573A), a technique related to an electric load driving IC used as a driving circuit in en electric control apparatus is disclosed. When an abnormal state is detected by an abnormal state detecting circuit, a power disconnection signal for forcibly fixing a control signal to a logic level on a disconnection side is generated continuously, and the signal is outputted from a signal output terminal to outside of the electric load driving IC.

In Patent Literature 3 (JP 2003-297929A), a circuit device having a plurality of overheat detecting circuits is disclosed. In a driver IC of the circuit device, the plurality of overheat detecting circuits are arranged in adjacent to each other. Each of the overheat detecting circuits includes a temperature detecting section, a reference voltage generating circuit, a comparator, and a switch circuit. The reference voltage generating circuit generates a reference voltage by using the resistance division of the plurality of resistances. The comparator compares an output voltage of the temperature detecting section with the reference voltage. The switch circuit is connected to at least one of the plurality of resistances in parallel, and is turned on and off on the basis of the control signal. When the temperature is rapidly increased by a short-circuited load, the switch circuit is turned off on the basis of the control signal from an overcurrent detecting circuit. When the switch circuit is turned off, the reference voltage rises to lower an overheat detection temperature. In this manner, the circuit device changes the reference voltage generated through resistance division of the plurality of resistances on the basis of the control signal of the overcurrent detecting circuit to lower the overheat detection temperature, and thereby prevents malfunction due to the heat transfer from an detection target of the overheat detecting circuit.

In addition, Patent Literature 4 (JP-A-Heisei 11-34765) discloses a circuit protection device for vehicle that two types of threshold values are set for overheat detection. The circuit protection device includes an output, circuit, a control circuit, an instructing circuit, and a setting circuit. The output circuit supplies electric power to drive a load driving device provided in a vehicle. The control circuit controls an amount of the power to be supplied from the output circuit. The instructing circuit detects a temperature, and outputs a change signal to change the power supply amount controlled by the control circuit when the detection temperature exceeds a predetermined threshold value. The setting circuit replaces the threshold value with a new threshold value of a different value when the amount of power supply exceeds a predetermined value. In this manner, the circuit protection device for vehicle sets two types of threshold values of the overheat detection.

The above-mentioned circuit detects an abnormal overheated state caused by a rapidly-increasing overcurrent and, prevents device destruction caused by the current surge. Accordingly, the threshold value in an overcurrent state is set to a value between a normal threshold value in a detection temperature (for example, 175° C.) and a normal threshold value in a recovery temperature (for example, 150° C.). Therefore, in a case of being in the overcurrent state for a long time due to a short-circuit of a load, the circuit is maintained in a high temperature state of the normal recovery temperature (for example, 150° C.) or more or of a rated operation temperature range (for example, 150° C.) or more, and accordingly a long-term reliability cannot be assured for a resin and a bonding wire.

It is said that an Au—Al bonding deterioration is an important defect mode in a power device and this is because a cower device operates under severe surrounding environment and large power in a common specification and becomes a high temperature. In an automobile field, an assurance requirement of the junction temperature of up to 170° C. is general for a elastic package. In this case, the solution of the Au—Al bonding deterioration problem becomes a key to assure the reliability.

CITATION LIST

[Patent Literature 1]: JP 2000-299631A
[Patent Literature 2]: JP 2001-257573A
[Patent Literature 3]: JP 2003-297929A
[Patent Literature 4]: JP-A-Heisei 11-34765

SUMMARY OF THE INVENTION

In an aspect of the present invention, semiconductor device includes a current supply section configured to control a current flowing through a load circuit; an overcurrent detecting circuit configured to detect based on the current, that an overcurrent flows through the load circuit, to output an overcurrent signal; and an overheat detecting circuit configured to detect that a peripheral temperature exceeds a detected temperature, in response to the overcurrent signal, and output an overheat detection signal. The overheat detecting circuit has a hysteresis to the detection temperature, and the detection temperature contains an overheat detection temperature used to detect an overheat state and a recovery temperature used to detect to have escaped from the overheat state. The semiconductor device further includes a drive control circuit configured to output the current control signal which indicates the quantity of the current flowing through the load circuit based on the overcurrent signal and the overheat detection signal in the electric current supply section.

In another aspect of the present invention, a circuit protection method is achieved by detecting an overcurrent flowing through a load circuit; by detecting an overheat state in which a peripheral temperature exceeds a detection target temperature; by changing the detection target temperature from a first detection temperature to a second detection temperature which is lower than the first detection temperature, for a predetermined time period after the detection of the overcurrent; and controlling a quantity of the current flowing through the load circuit based on the detection of the overheating state and the detection of the overcurrent. When it is detected that the peripheral temperature exceeds the detection target temperature, the first detection temperature is set to a first recovery temperature and the second detection temperature is set to a second recovery temperature. When it is detected that the peripheral temperature falls lower than the detection target temperature, the first detection temperature is set to a first overheat temperature which is higher than the first recovery temperature and the second detection temperature is set to a second overheat temperature which is higher than the second recovery temperature.

According to the present invention, a semiconductor device and a circuit protection method for preventing a continuation of an abnormal high temperature state and realizing an assurance of a long-term reliability can be provided.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Figure 1:
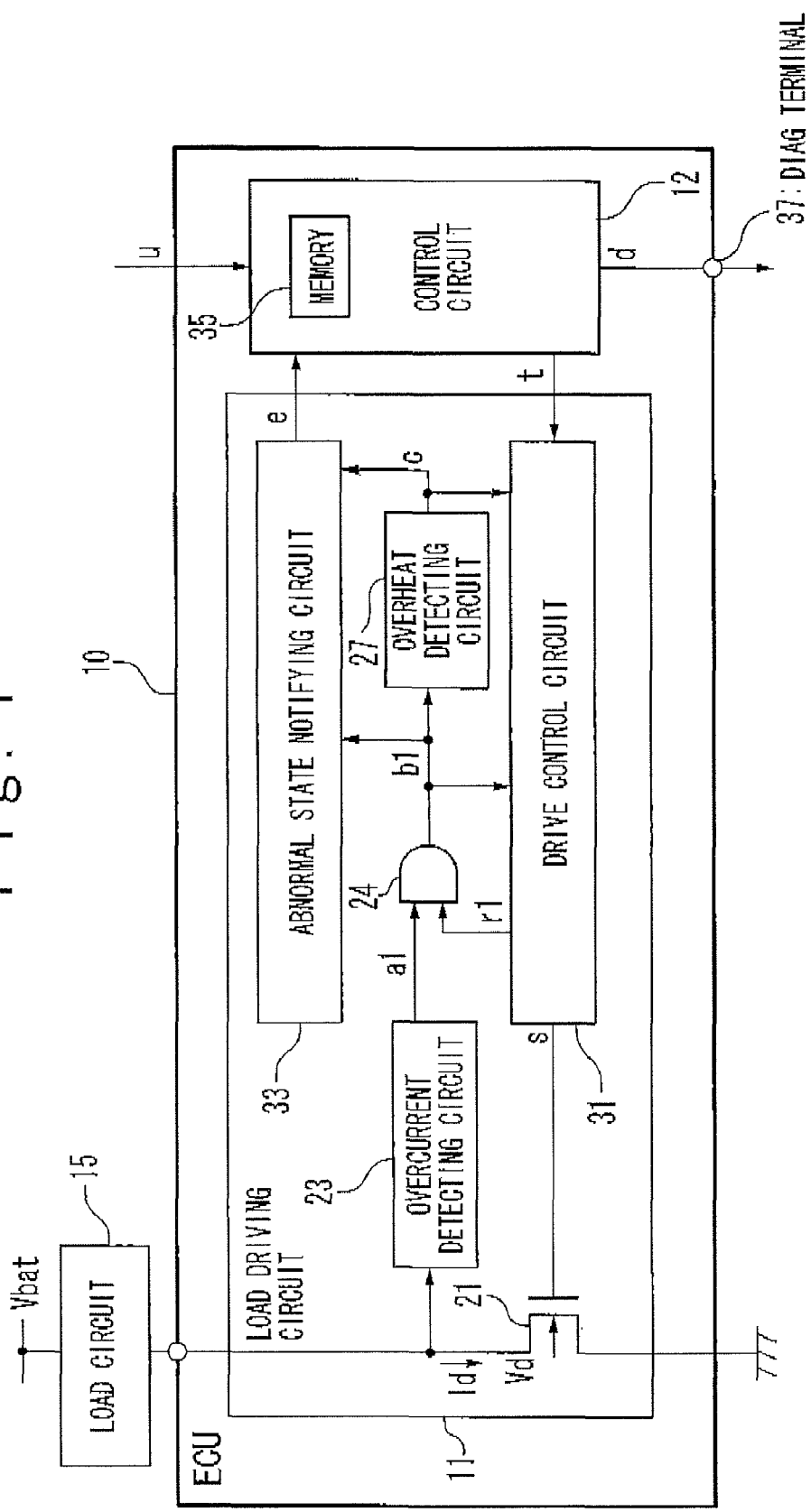
FIG. 1 is a diagram showing a configuration of an ECU as a semiconductor device according to a first embodiment of the present invention.

FIG. 1 shows a block diagram of a semiconductor device according to a first embodiment of the present invention. As the semiconductor device, an engine control unit (ECU) for an automobile electric component is exemplified. An engine control unit 10 includes a control circuit 12 having a memory 35, and a load driving circuit 11, and controls an electric current flowing through a load circuit 15.

The load driving circuit 11 includes an output transistor 21, an overcurrent detecting circuit 23, a detection period setting circuit 24, an overheat detecting circuit 27, a drive control circuit 31, and an abnormal state notifying circuit 33. The output transistor 21 controls a current flowing through the load circuit 15 in response to a control signal s outputted from the drive control circuit 31. A drain voltage Vd of the output transistor 21 is supplied to the overcurrent detecting circuit 23.

Figure 2:
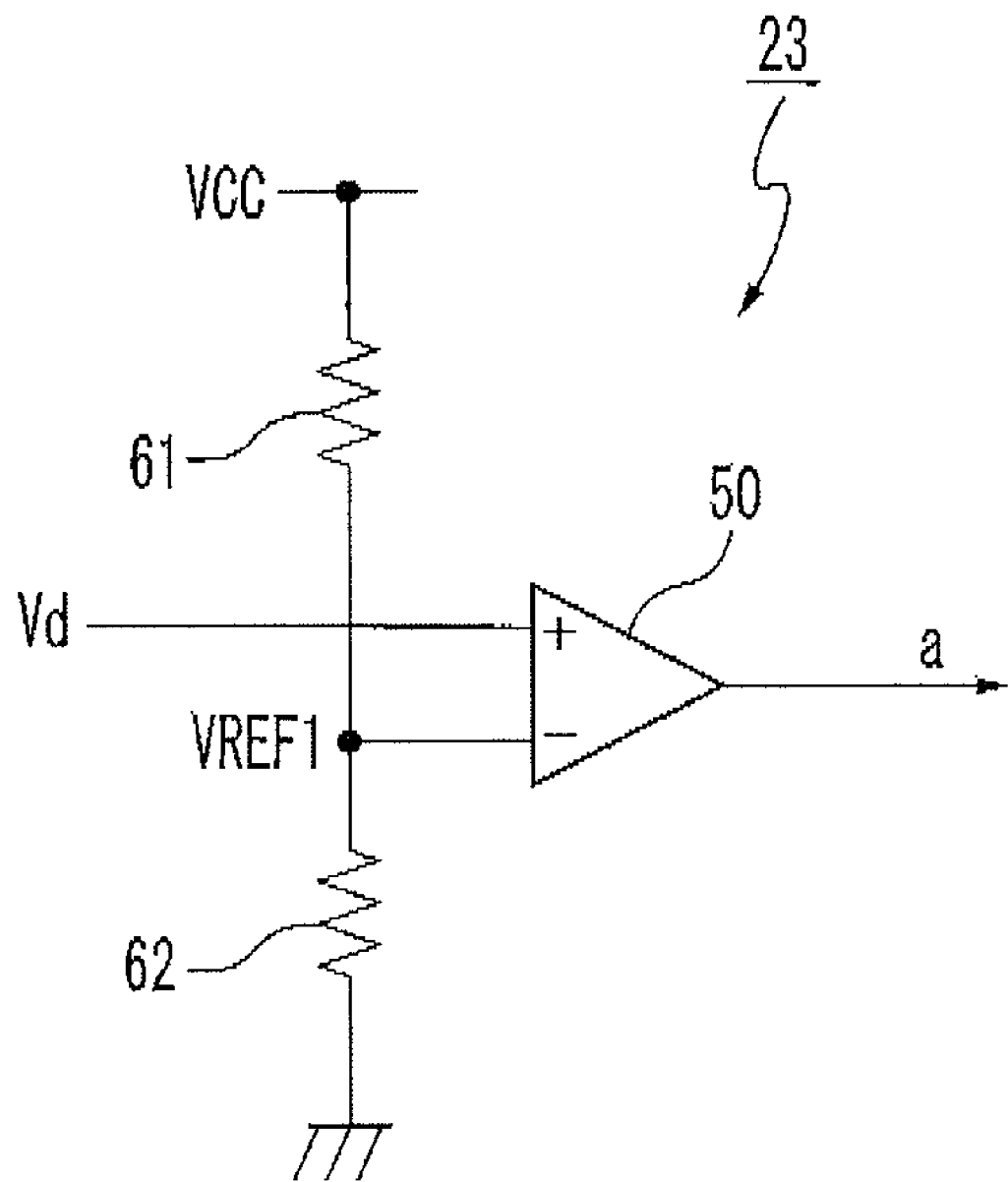
FIG. 2 is a diagram showing a configuration example of an overcurrent detecting circuit of the present invention.

As shown in FIG. 2, the overcurrent detecting circuit 23 includes a comparator 50 and resistance elements 61 and 62. The comparator 50 compares a reference voltage VREF1 with the drain voltage Vd of the output transistor 21, and outputs an overcurrent detection signal a (corresponding to a signal a1 of the load driving circuit 11). The reference voltage VREF1 is generated by dividing a stable power supply voltage VCC by the resistance elements 61 and 62. When resistance values of the resistance elements 61 and 62 are R1 and R2, the reference voltage VREF1 is $$VREF1 = VCC \times R2/(R1+R2).$$

During a normal operation in the load circuit 15, the drive control circuit 31 applies a bias to the output transistor 21 so that the drain voltage Vd cannot influence the operation of the load circuit 15. When an abnormal current flows due to a short-circuit in the load circuit 15, the drain voltage Vd rapidly rises. When the drain voltage Vd rises to be higher than the reference voltage VREF1, the comparator 50 sets the overcurrent detection signal a active (a high level).

When a current supplied to the load circuit 15 is blocked off, the drain voltage of the output transistor 21 becomes high, and thus, the overcurrent detecting circuit 23 sets the overcurrent detection signal a1 active in the same manner as that of the detection of overcurrent. Accordingly, the detection period setting circuit 24 processes the overcurrent detection signal a1 so as to represent that a normal current has been supplied to the load circuit 15 and that the overcurrent has been detected in a period during which the overcurrent has to be detected. Here, the detection period setting circuit 24 includes an AND Circuit. While a reset signal r1 outputted from the drive control circuit 31 is in a high level, the detection period setting circuit 24 outputs a signal outputted from the drive control circuit 31 as an overcurrent signal b1. Accordingly, when the output transistor 21 blocks the current supplied to the load circuit 15, a detection error of overcurrent can be prevented by setting the reset signal to a low level. In addition, when an overcurrent flows through the load circuit 15 and the current is blocked, a detected state of the overcurrent can be maintained by setting the reset signal r1 to the high level. The detection of the overcurrent is notified to the drive control circuit 31 and the abnormal state notifying circuit 33 by the overcurrent signal b1.

Figure 3:
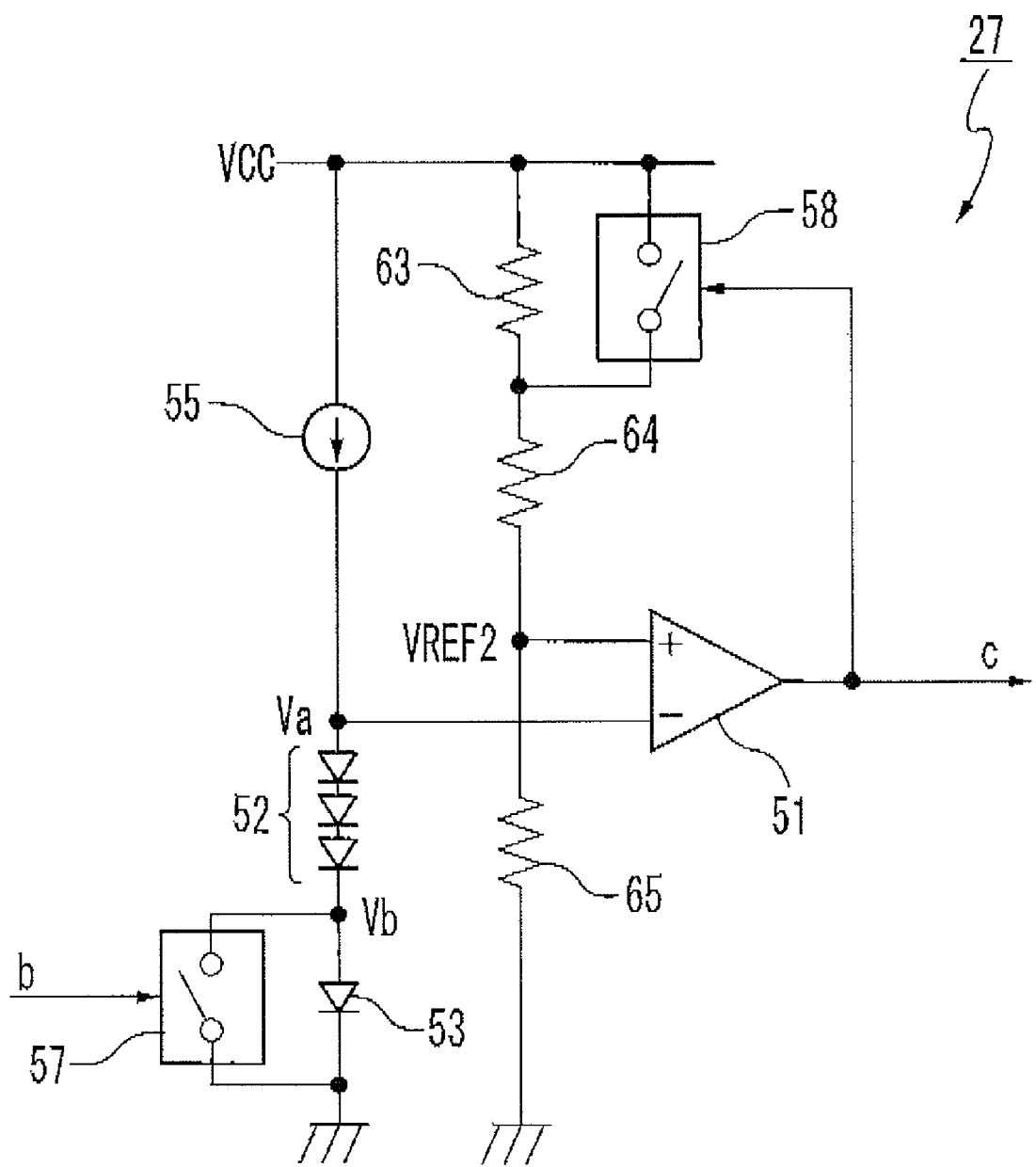
FIG. 3 is a diagram showing a configuration of an overheat detecting circuit of the present invention.

As shown in FIG. 3, the overheat detecting circuit 27 includes a comparator 51, resistance elements 63 to 65, switch circuits 57 and 58, diodes 52 and 53, and a constant current source 55. The diodes 52 of the predetermined number are connected in series. In an example shown in FIG. 3, three diodes are connected in series. The constant current source 55 and the diodes 52 and 53 are connected in series, and a voltage Va at a connection node between the constant current source 55 and the diodes 52 is given to one of inputs of the comparator 51. A forward voltage when a constant current is supplied to the diodes 52 and 53 varies depending on a junction temperature. When the junction temperature is increased, the forward voltage is lowered, and when the junction temperature is reduced, the forward voltage rises. That is, the diodes 52 and 53 serve as temperature sensors, and the voltage Va varies depending on the junction temperature. The overheat detecting circuit 27 detects an overheat state by using a temperature characteristic of the forward voltage Va of the diodes 52 and 53.

The switch circuit 57 is connected to the diode 53 in parallel and is controlled by an overcurrent signal b (equivalent to an overcurrent signal b1 outputted from the detection period setting circuit 24 in the present embodiment). When the overcurrent signal b is inactive (low level) and the switch circuit 57 is in an open state, the forward current flows through the diodes 52 and 53, a summation of the forward voltages (the voltages of the four diodes in FIG. 3) becomes the voltage Va. When the overcurrent signal b becomes active (high level) and the switch circuit 57 is in a close state, the diode 53 is bypassed by the switch circuit 57. Thus, the voltage Va represents the forward voltages of the diodes 52. That is, the voltage Va is controlled by the overcurrent signal b, and an overheat detection temperature can be changed depending on the overcurrent signal b.

The voltage Va of the temperature sensor is obtained as follows. It is assumed that a forward voltage of a diode when a peripheral temperature Ta is equal to 25° C. is VF and the number of temperature sensor diodes is N. In this case, the voltage Va when the peripheral temperature is 25° C. is:

$$Va = VF \times N$$

Since the forward voltage of the diode has a negative correlation to the temperature, it is assumed that a temperature coefficient thereof is θ. In this case, the voltage Va of the temperature sensor in the peripheral temperature Ta is $$Va = (VF - \theta \times (Ta - 25)) \times N$$

For example, as shown in FIG. 3, it is assumed that the number N of diodes for the temperature sensor is four and that the comparator 51 is configured so as to detect the overheat state of 175° C. Since the voltage Va for the temperature sensor to be compared are same, the temperature Ta at which the overheat state is detected when the number N of diodes is switched to three is obtained from:

$$(VF - \theta \times (175 - 25)) \times 4 = (VF - \theta \times (Ta - 25)) \times 3$$

When the diode forward voltage VF in the peripheral temperature of 25° C. is 0.7V and the temperature coefficient θ is equal to 0.002 V/° C., it is obtained that Ta is nearly equal to 108° C. That is, the overheat detection temperature when the number of diodes for the temperature sensor is switched to be three is reduced to 108° C.

The voltage Va of this temperature sensor is compared with a reference voltage VREF2 generated by the resistance elements 63 to 65. The overheat detection temperature is set by adequately setting the resistance elements 63 to 55. The resistance elements 63 to 65 are connected in series and the reference voltage VREF2 is generated by dividing the stable power supply voltage VCC by the resistance elements. A desired overheat detection temperature can be obtained by adequately setting: the forward voltages of the diodes 52 and 53, and the reference voltage VREF2.

In addition, the switch circuit 58 is connected to the resistance element 63 in parallel and controlled by an output of the comparator 51. Accordingly, the reference voltage VREF2 varies depending on the output of the comparator 51.

When the normal operation is carried out and the junction temperature is low, the voltage Va is higher than the reference voltage VREF2, and an overheat detection signal c that is the output of the comparator 51 is inactive (low level). In this case, the switch circuit 58 is in an open state. When the resistance values of the resistance elements 63 to 65 are R3 to R5, respectively, the reference voltage VREF2 (or a voltage VREF21) is:

$$VREF21 = VCC \times R5 / (R3 + R4 + R5)$$

When the junction temperature is high, the voltage Va becomes lower than the reference voltage VREF2. Accordingly, the overheat detection signal c becomes active (high level), and the switch circuit 58 is turned into a close state. The switch circuit 58 bypasses the resistance element 63, and at this time, the reference voltage VREF2 (or a voltage VREF22) is $$VREF22 = VCC \times R5 / (R4 + R5)$$

Since the reference voltage VREF21 is less than the reference voltage VREF22, the overheat detection signal c does not become inactive (low level) if the overheat detection signal c does not become a higher voltage than that at which the overheat detection signal c becomes active (high level), that is, the junction temperature does not become lower. Due to the switch circuit 58, the overheat detecting circuit 27 has hysteresis as a result. A width of the hysteresis can be adjusted by the resistance elements 63 to 65. For example, resistance values R3 to R5 of the resistance elements 63 to 65 can be set so that the overheat detection temperature can be 175° C. and the recovery temperature can be 150° C. In this case, when the number of diodes for the temperature sensor is switched from four to three to lower the overheat detection temperature to 108° C., the recovery temperature is also lowered to 83° C.

The overheat detection signal c generated in this manner is outputted to the drive control circuit 31 and the abnormal state notifying circuit 33. In response to a control instruction signal t outputted from the control circuit 12, the drive control circuit 31 controls the output transistor 21 to supply a current to the load circuit 15 and to stop the supply. During the supply of current to the load circuit 15, the drive control circuit 31 restricts the current supplied to the load circuit 15 in response to the overcurrent signal b1, and blocks off the current supplied to the load circuit 15 in response to the overheat detection signal c. It can be prevented to unnecessarily apply a large current and to be high temperature by restricting and blocking off the supply current.

In addition, the drive control circuit 31 outputs a reset signal r1 to the detection period setting circuit 24 to set a detection period of the overcurrent. This reset signal r1 will be in a high level at a time of start of the current supply shown by the control instruction signal t outputted from the control circuit 12, and validates the detection of overcurrent. The reset signal r1 will be in a low level while the control instruction signal t instructs the stop of the current supply, and invalidates the detection of overcurrent.

In response to the overcurrent signal b1, the abnormal state notifying circuit 33 recognizes occurrence of an abnormal state that the overcurrent has flowed through the load circuit 15. In addition, the abnormal state notifying circuit 33 recognizes in response to the overhear detection signal c, that the abnormal state that the temperature around the overheat detecting circuit 27 has become high has occurred. Upon the detection of these abnormal states, the abnormal state notifying circuit 33 outputs an abnormal state warning signal e to notify the occurrence of the abnormal state to the control circuit 12.

The control circuit 12 stores data representing the notified abnormal state in the memory 35, and outputs a diag code d including data of these abnormal states from a DIAG terminal 37 in response to a request from the outside. In addition, in response to an instruction signal u from the outside, the control circuit 12 outputs the control instruction signal t to the drive control circuit 31 to instruct the drive control circuit 31 to start and stop the driving of the output transistor 21.

Figure 4:
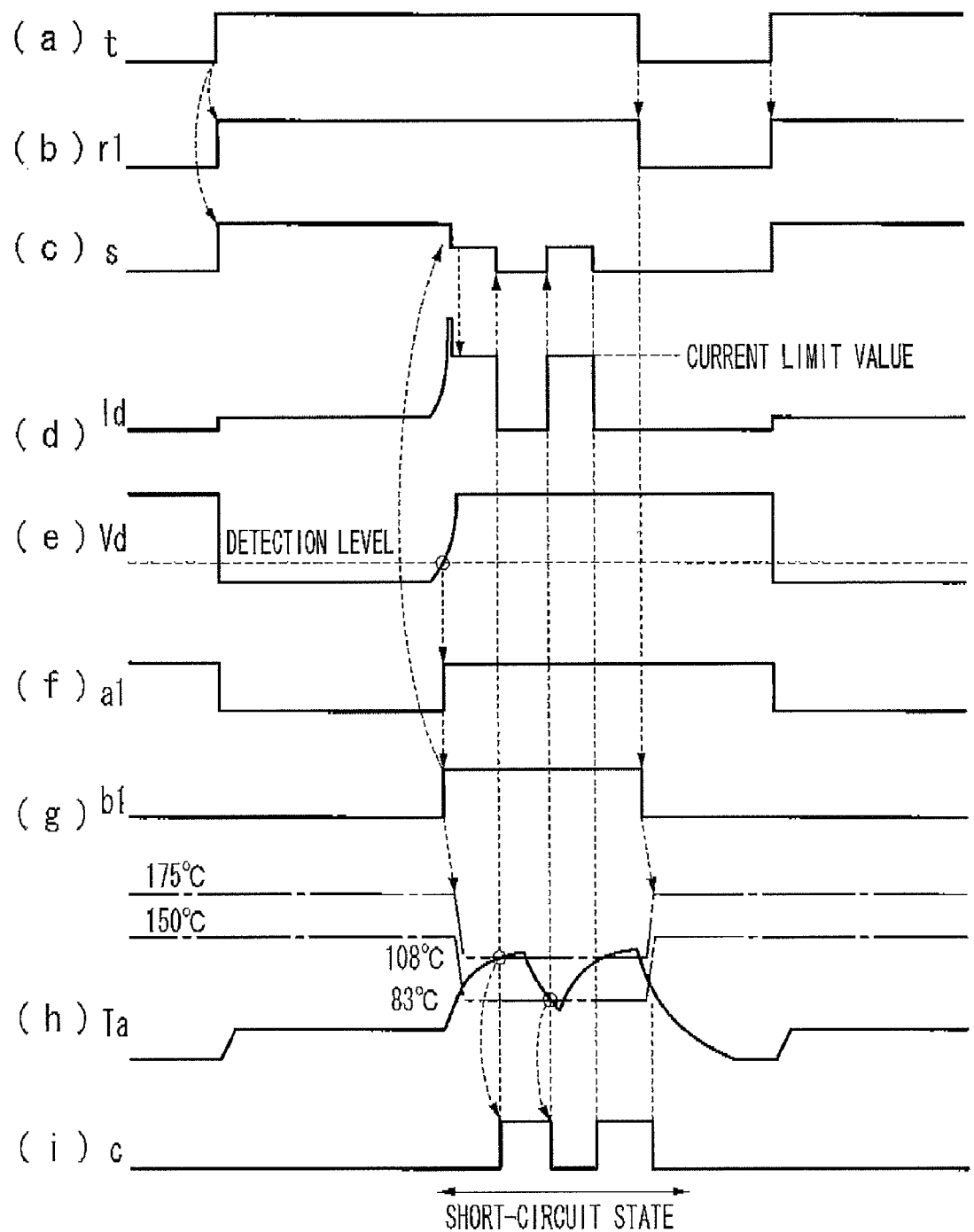
FIG. 4 is a diagram showing an overheat detection operation of the ECU according to the first embodiment of the present invention.

Referring to FIG. 4, an operation of the engine control unit 10 will be described. The engine control unit 10 receives the instruction to drive the load circuit 15. When receiving an instruction signal u instructing to start the current supply, the control circuit 12 sets the control instruction signal t to be active (high level) ((a) of FIG. 4). The drive control circuit 31 sufficiently increases the current control signal s supplied to a gate of the output transistor 21, and sets the output transistor 21 to be in an on state ((c) of FIG. 4). In addition, the drive control circuit 31 sets the reset signal r1 supplied to the detection period setting circuit 24 to be in a high level, and validate the overcurrent detection ((b) of FIG. 4). An on-resistance of the output transistor 21 is set to be sufficiently small so as not to influence the operation of the load circuit 15. That is, the gate voltage of the output transistor 21 at this time is set to be relatively high.

When the output transistor 21 is in the on state, a current flows through the load circuit 15 and also flows through the output transistor 21 connected in series as the drain current Id ((d) of FIG. 4). In this case, the current the normal operation flows, and the drain voltage Vd becomes lower than a detection level ((e) of FIG. 4). The overcurrent detecting circuit 23 does not detect the overcurrent, and accordingly sets the overcurrent detection signal a1 to be inactive (low level) ((f) of FIG. 4). The overcurrent signal b1 outputted from the detection period setting circuit 24 is set to be inactive (low level) to indicate the normal operation state (FIG. 4(g)). Accordingly, the switch 57 of the overheat detecting circuit 27 is opened, and the overheat detecting circuit 27 compares a voltage Va representing a voltage drop of the diodes 52 and diode 53 connected in series with the reference voltage VREF2 (the voltage VREF21).

Here, when the load circuit 15 is short-circuited due to a certain cause, an abnormal current flows. When the drain voltage Vd of the output transistor 21 exceeds a predetermined detection level (a dashed line in (e) of FIG. 4) due to the abnormal current, the overcurrent detecting circuit 23 sets the overcurrent detection signal a1 to be active (high level) as shown in FIG. 4(f). When the overcurrent detection signal a1 becomes active, the reset signal r1 is in a high level, and accordingly the detection period setting circuit 24 sets the overcurrent signal b1 to be in the high level to notify the overcurrent ((g) of FIG. 4). When the detection of overcurrent is notified, the drive control circuit 31 lowers the current control signal s to restrict the current flowing through the load circuit 15 ((c) and (d) of FIG. 4). Meanwhile, when the overcurrent signal b1 becomes active, the overheat detecting circuit 27 closes the switch 57 to switch the detection temperature setting. In the present embodiment, the overheat detection temperature is switched from 175° C. to 108° C., and the recovery temperature is switched from 150° C. to 83° C., for example ((h) of FIG. 4).

When the temperature rises and the junction temperature of the temperature sensor exceeds the overheat detection temperature (108° C. here) ((b) of FIG. 4), the overheat detecting circuit 27 sets the overheat detection signal c to be active (high level) ((i) of FIG. 4). When the overheat detection signal c becomes active, the drive control circuit 31 controls the current control signal s so as to block off the supply current (FIG. 4(C)). Accordingly, the current flowing through the output transistor 21 is blocked off ((d) of FIG. 4). In this case, as shown in (e) of FIG. 4, the voltage Vd exceeds the detection level. Thus, as shown in (f) of FIG. 4, the output (the overcurrent detection signal a1) of the overcurrent detecting circuit 23 is maintained in the active (high level) state. In addition, when the overheat detection signal c becomes active, the switch 58 bypasses the resistance element 63. In this manner, if the peripheral temperature of the temperature sensor does not fall lower than the recovery temperature (83° C. here), the comparator 51 does not set the overheat detection signal c to be inactive (low level) ((h) and (i) of FIG. 4).

When the supply current stops and the peripheral temperature of the temperature sensor has dropped due to stop of the heat generation of the load circuit 15, the forward voltage of the diodes of temperature sensor rises. When the peripheral temperature becomes lower than the recovery temperature (83° C. in this example), the overheat detection signal c is cancelled and becomes inactive (low level) ((i) of FIG. 4). That is, after the voltage Va sufficiently raised, the overheat detection signal c becomes inactive. The switch 58 is opened, the resistance element 64 is connected to the power supply voltage VCS: via the resistance element 63, and thus the reference voltage VREF2 drops. When the overheat detection signal c becomes inactive, the drive control circuit 31 raises the current control signal s connected to the gate of the output transistor 21 to restart the current supply to the load circuit 15 ((c) of FIG. 4). In this case, if the cause by which the load circuit 15 is short-circuited is eliminated, the load circuit 15 is driven in a normal current value. However, as shown in FIG. 4, the overcurrent is detected and accordingly the supply current is restricted when the short-circuited state continues. When the heat-generation further continues, the overheat state is detected and the supply current is blocked. This operation is repeated while the instruction to drive the load circuit 15 continues. This repetition period for which the overheat detection is repeated is called a thermal toggle period.

When the control instruction signal t is set to be in the off state ((a) of FIG. 4), the drive control circuit 31 stops the current supply to the load circuit 15. In this case, the drive control circuit 31 sets the reset signal r1 to be in the low level and outputs the signal to the detection period setting circuit 24, and the overcurrent signal b1 becomes inactive after the overcurrent detection ends (FIG. 4(g)). When the overcurrent signal b1 becomes inactive, the overheat detecting circuit 27 opens the switch 57, and resets the overheat detection temperature and the recovery temperature to be the preset temperatures (175° C. and 150° C. here) ((h) of FIG. 4).

The overcurrent signal b1 and the overheat detection signal c are both supplied to the abnormal state notifying circuit 33. The abnormal state notifying circuit 33 notifies to the control circuit 12 that the overcurrent has flowed and that the overheat state has detected, and the control circuit 12 stores the notice in the built-in memory 35. When receiving the instruction signal u for data output, the control circuit 12 outputs the data of these abnormal states as a diag code d via the DIAG terminal 37.

As described above, in a simple circuit configuration, it is able to lower the overheat detection temperature when detecting the overcurrent and thus to control current supply so that the overheat state is not continued for a long period. Accordingly, the operation can be carried out for the long period without exceeding a rated operation temperature range, and thus a long-term reliability can be assured. In addition, since data representing the abnormal state is stored and can be outputted arbitrarily, only the load device 15 in the abnormal state can be replaced. Moreover, when receiving the notice of the abnormal state occurrence, the control circuit 12 may notify the abnormal state occurrence to outside without an instruction from the outside.

Since the occurrence of an abnormal state is notified to the control circuit 12 and the supply current is blocked, the ECU itself can be protected and repairing is sufficient by replacing only the load device 15. When the ECU recognizes the abnormal state occurrence, an engine check lamp is lit so as to warn a driver. In this case, a data indicative of a portion in the abnormal state is stored in the ECU and is not erased only by turning off a power supply. An operation to read the stored data is the read of the diag code. When an abnormal state code is read, a recovery operation can be carried out efficiently by checking and repairing the portion preferentially.

Figure 5:
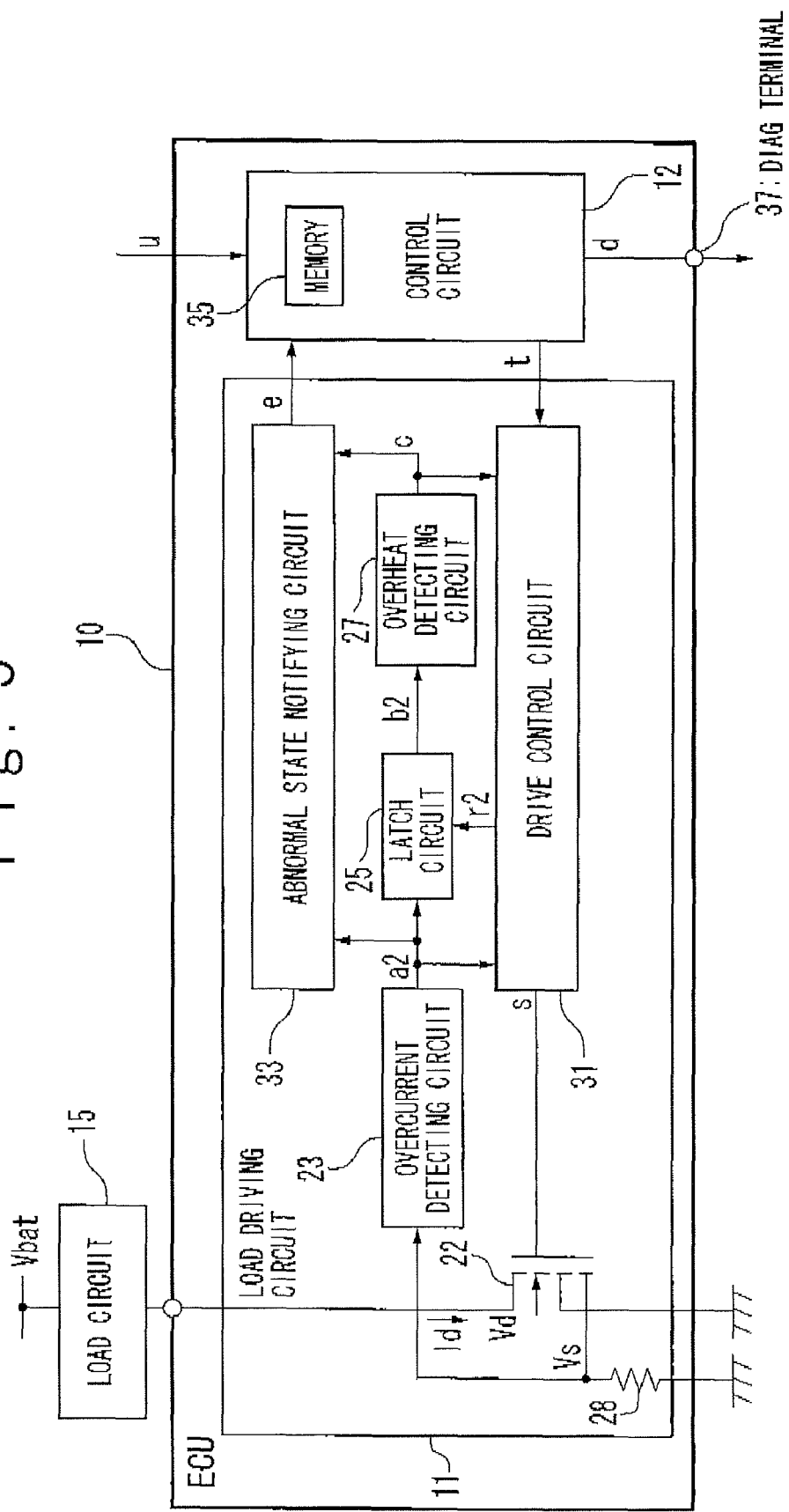
FIG. 5 is a diagram showing a configuration of an ECU according to a second embodiment of the present invention.

FIG. 5 shows a block diagram of a semiconductor device according to a second embodiment of the present invention. Compared to the first embodiment, in the second embodiment, the output transistor 21 is replaced by a multi-source output transistor 22, and the detecting method of the overcurrent is changed. As the semiconductor device, the engine control unit (ECU) for an automobile electric component is exemplified. The engine control unit 10 includes the control circuit 12 having the memory 35, and the load driving circuit 11, and controls and drives a current flowing through the load circuit 15.

The load driving circuit 11 includes the output transistor 22, the overcurrent detecting circuit 23, a latch circuit 25, the overheat detecting circuit 27, the drive control circuit 31, and the abnormal state notifying circuit 33. The output transistor 22 controls the current flowing through the load circuit 15 in response to the control signal s outputted from the drive control circuit 31. The drain current Id of the output transistor 22 flows via a plurality of sources. Most of the sources is for the load current, and other sources are for supplying a current proportional to the load current to a resistance element 28 such that a voltage Vs generated in the resistance element 28 is outputted to the overcurrent detecting circuit 23.

The overcurrent detecting circuit 23 is the same as the circuit shown in FIG. 2 which has been described in the first embodiment, and accordingly the detailed description is omitted. The overcurrent detecting circuit 23 indirectly measures the drain current Id by using the voltage Vs generated by the resistance element 28. During the normal operation of the load circuit 15, the drive control circuit 31 applies a bias to a gate of the output transistor 22 so that the drain voltage Vd cannot influence the operation of the load circuit 15. When an abnormal current flows due to a short-circuit defect of the load circuit 15, the voltage Vs rapidly rises. When the voltage Vs rises to be higher than the reference voltage VREF1, the comparator 50 sets the overcurrent detection signal a (shown as the signal a2 in FIG. 5) to be active (the high level).

The overcurrent detecting circuit 23 notifies the detection of overcurrent to the drive control circuit 31 and the abnormal state notifying circuit 33 by the overcurrent detection signal a2. In addition, the overcurrent detection signal a2 is also supplied to the latch circuit 25. The latch circuit 25 includes a flip-flop (not shown) and holds the state of the overcurrent detection and outputs the overcurrent signal b2 to the overheat detecting circuit 27. The latch circuit 25 resets the overcurrent detection state in response to the reset signal r2 outputted by the drive control circuit 31.

The overheat detecting circuit 27 is the same as the circuit shown in FIG. 3, which has been described in the first embodiment, and accordingly the detailed description is omitted. However, the circuit has hysteresis and can change the overheat detection temperature in accordance with the overcurrent signal b2. The overheat detection signal c generated by the overheat detecting circuit 27 is supplied to the drive control circuit 31 and the abnormal state notifying circuit 33. In response to the control instruction signal t outputted from the Control circuit 12, the drive control circuit 31 controls the output transistor 22 to supply a current to the load circuit 15 and to stop the supply. During the supply of current to the load circuit 15, the drive control circuit 31 restricts the current supplied to the load circuit 15 in response to the overcurrent detection signal a2, and blocks off the current supplied to the load circuit 15 in response to the overheat detection signal c. By restricting and blocking the supply current, it is possible to prevent the supply of unnecessarily-large current and rise to a high temperature.

In addition, the drive control circuit 31 outputs the reset signal r2 to reset the latch circuit 25 for holding the overcurrent detection state. It is preferable that the reset signal r2 is set active to reset the latch circuit 25, when the control instruction signal t outputted from the control circuit 12 shows the start of current supply. The reset signal r2 may be active during a period during which the control instruction signal t instructs the stop of current supply.

In response to the overcurrent detection signal a2, the abnormal state notifying circuit 33 recognizes occurrence of the abnormal state that the overcurrent flows through the load circuit 15. Or, the abnormal state due to the overcurrent may be recognized by the overcurrent signal b2. In addition, the abnormal state notifying circuit 33 recognizes in response to the overheat detection signal c, that the abnormal state that the peripheral temperature of the overheat detecting circuit 27 becomes high has occurred. The abnormal state notifying circuit 33 outputs an abnormal state warning signal e to notify occurrence of these abnormal states to the control circuit 12.

The control circuit 12 stores data indicating the notified abnormal states in the memory 35, and outputs the diag code d including the data indicative of these abnormal states from the DIAG terminal 37 in response to a request from the outside. In addition, in response to the instruction signal u from the outside, the control circuit 12 outputs the control instruction signal t to instruct the drive control circuit 31 to start and stop the driving of the output transistor 22.

Figure 6:
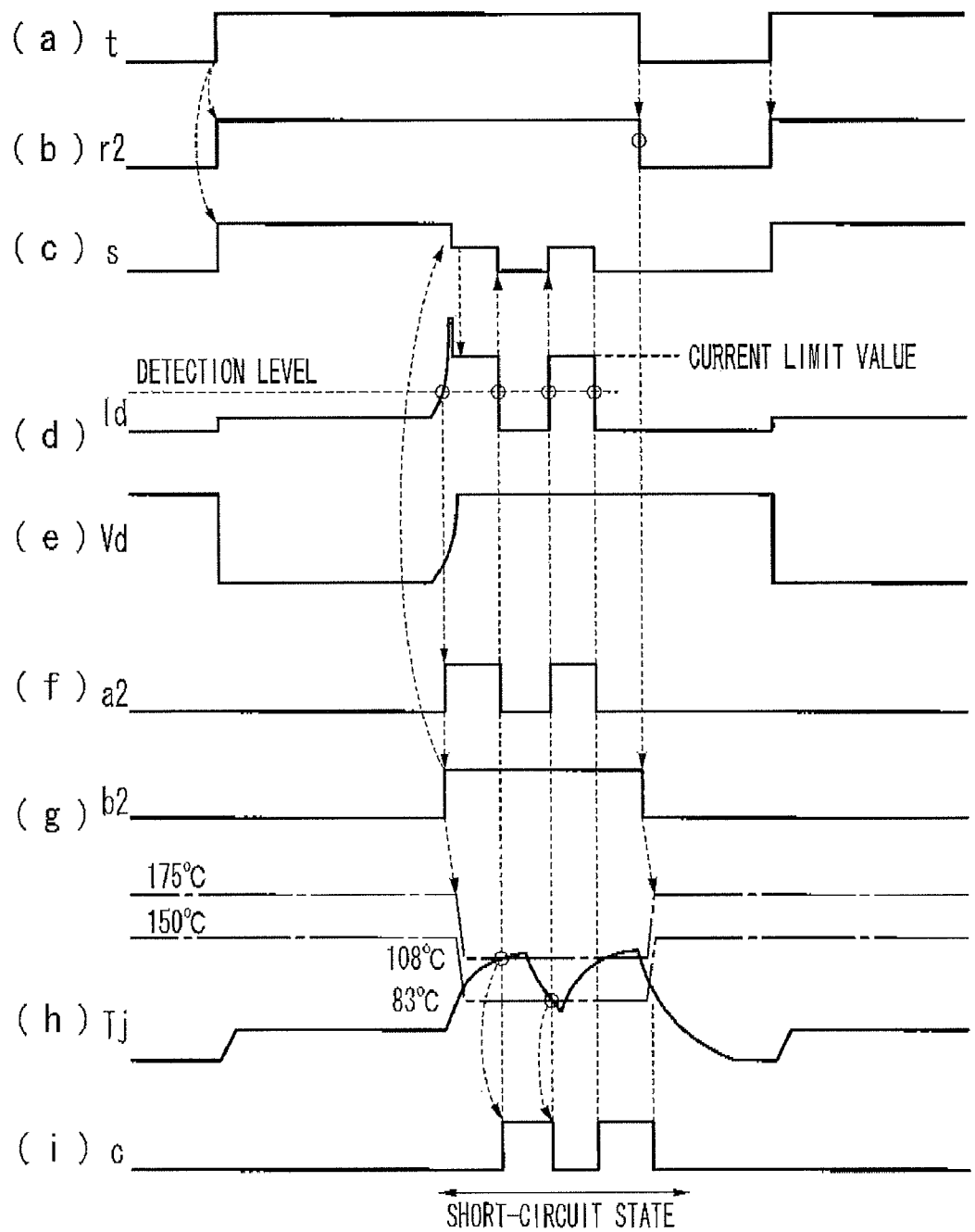
FIG. 6 is a diagram explaining an overheat detection operation of the ECU according to the second embodiment of the present invention.

Referring to FIG. 6, the operation of the engine control unit 10 will be explained.

The engine control unit 10 receives an instruction to drive the load circuit 15. When receiving the instruction signal u instructing to start the current supply, the control circuit 12 sets the control instruction signal t to be active (high level) ((a) of FIG. 6). The drive control circuit 31 sufficiently increases the current control signal s supplied to a gate of the output transistor 22 and sets the output transistor 22 to be in an on state ((c) of FIG. 6). An on resistance of the output transistor 22 is set to be sufficiently small so as not to influence the operation of the load circuit 15. That is, the gate voltage of the output transistor 22 at this time is set to be high.

When the output transistor 22 is in the on state, a current flows through the load circuit 15 and also flows through the output transistor 22 connected in series as the drain current Id ((d) of FIG. 6). In this case, the current in the normal operation flows, the overcurrent detecting circuit 23 does not detect the overcurrent, and the overcurrent detection signal a2 represents the inactive state (low level) ((f) of FIG. 6). The latch circuit 25 shows the normal operation state and the overcurrent latch signal b2 is set to be inactive (low level) ((g) of FIG. 6). Accordingly, the switch 57 of the overheat detecting circuit 27 is opened, and the overheat detecting circuit 27 compares the voltage Va due to a voltage drop of the diodes 52 and diode 53 connected in series with the reference voltage VREF2 (the voltage VREF21).

Here, when the load circuit 15 is short-circuited due to a certain cause, an abnormal current flows and the drain voltage Vd of the output transistor 22 rises. When the voltage Vs of the resistance 28 exceeds a predetermined detection level (a dashed line in (d) of FIG. 6) due to the abnormal current, the overcurrent detecting circuit 23 sets the overcurrent detection signal a2 to be active (high level) as shown in (f) of FIG. 6. When the overcurrent detection signal a2 is set to be active, the drive control circuit 31 decreases the level of the current control signal s to restrict the current flowing through the load circuit 15 ((c) and (d) of FIG. 6). Meanwhile, the latch circuit 25 latches the overcurrent detection signal a2 and raises the overcurrent signal b2 (high level) as shown in (g) of FIG. 6. When the overcurrent latch signal b2 is set to be active, the overheat detecting circuit 27 closes the switch 57 to switch the detection temperature setting. In the present embodiment, the overheat detection temperature is switched from 175° C. to 108° C., and the recovery temperature is switched from 150° C. to 83° C., for example ((h) of FIG. 6).

When the temperature rises and the junction temperature of the temperature sensor exceeds the overheat detection temperature (108° C. here) ((h) of FIG. 6), the overheat detecting circuit 27 sets the overheat detection signal c to be active (high level) ((i) of FIG. 6). When the overheat detection signal c is set to be active, the drive control circuit 31 controls the current control signal s so as to block off the supply current ((c) of FIG. 6). Accordingly, the current flowing through the output transistor 22 is blocked off ((d) of FIG. 6). In addition, when the overheat detection signal c is set to be active ((i) of FIG. 6), the switch 58 bypasses the resistance element 63. In this manner, if the peripheral temperature of the temperature sensor does not falls lower than the recovery temperature (83° C. here), the comparator 51 does not set the overheat detection signal c to be inactive (low level).

When the current supply is stopped so that the peripheral temperature of the temperature sensor decreases, the forward voltage of the diodes as the temperature sensor rises. When the peripheral temperature becomes lower than the recovery temperature (83° C. here), the overheat detection signal c is set to be inactive (low level) ((h) and (i) of FIG. 6). That is, after the voltage Va sufficiently raises, the overheat detection signal c is set to be inactive. The switch 58 is opened, the resistance element 64 is connected to the power supply voltage VCC via the resistance element 63, and thus the reference voltage VREF2 falls. When the overheat detection signal c is set to be inactive, the drive control circuit 31 raises the current control signal s ((c) of FIG. 6) to restart the current supply to the load circuit 15 ((d) of FIG. 6). In this case, if the cause of a state that the load circuit 15 is short-circuited is removed, the load circuit 15 is driven in a normal current value. However, as shown in FIG. 6, the overcurrent is detected while the short-circuited state continues, the current supply is restricted. Or, the current supply is maintained to be restricted while the overcurrent signal b2 is in the active state (high level).

When the control instruction signal t is turned off ((a) of FIG. 6), the drive control circuit 31 stops the current supply to the load circuit 15. In this case, the drive control circuit 31 outputs the reset signal r2 to the latch circuit 25 to reset the signal ((b) of FIG. 6). Or, the latch circuit 25 is reset when the control instruction signal t instructs next start of the current supply. In the case of the resetting in response to the instruction of the start of the current supply, when the control instruction signal t is set to be active (high level), the drive control circuit 31 raises the current control signal s, and outputs the reset signal r to the latch circuit 25 to reset the overcurrent latch signal b. When the overcurrent signal b2 is reset ((g) of FIG. 6), the overheat detection temperature and the recovery temperature are reset to the normal preset temperatures (175° C. and 150° C. here) ((h) of FIG. 6).

The overcurrent signal a and the overheat detection signal c are also supplied to the abnormal state notifying circuit 33. The abnormal state notifying circuit 33 notifies to the control circuit 12 that the overcurrent flows and that the overheat state is detected, and the control circuit 12 stores the notices in the built-in memory 35. When receiving the instruction signal u instructing to output data, the control circuit 12 outputs the data of these abnormal states as a diag code via the DIAG terminal 37.

As described above, in the simple circuit configuration, it is able to lower the overheat detection temperature when detecting the overcurrent and to control the current supply so that the overheat state is not continued for a long period. Accordingly, the operation can be carried out for the long period without exceeding a rated operation temperature range, and thus a long-term reliability can be assured. In addition, since the data of the abnormal states are stored and can be outputted arbitrarily, the repairing can be performed only by replacing the load device 15. Moreover, when receiving the notice of the abnormal state occurrence, the control circuit 12 may notify the abnormal state occurrence to an outside without any instruction from the outside.

Since the abnormal state occurrence is notified to the control circuit 12 and the supply current is blocked, the ECU itself can be protected and the abnormal state can be eliminated by replacing only the load device 15. When the ECU recognizes the abnormal state occurrence, an engine check lamp is lit so as to warn a driver. In this case, data indicating the cause portion of the abnormal state is stored in the ECU and is not erased only by turning off the power supply. An operation to read the stored data is the read of the diag code. When a trouble code is read, a recovery operation can be carried out efficiently by checking and repairing the portion preferentially.

Figure 7:
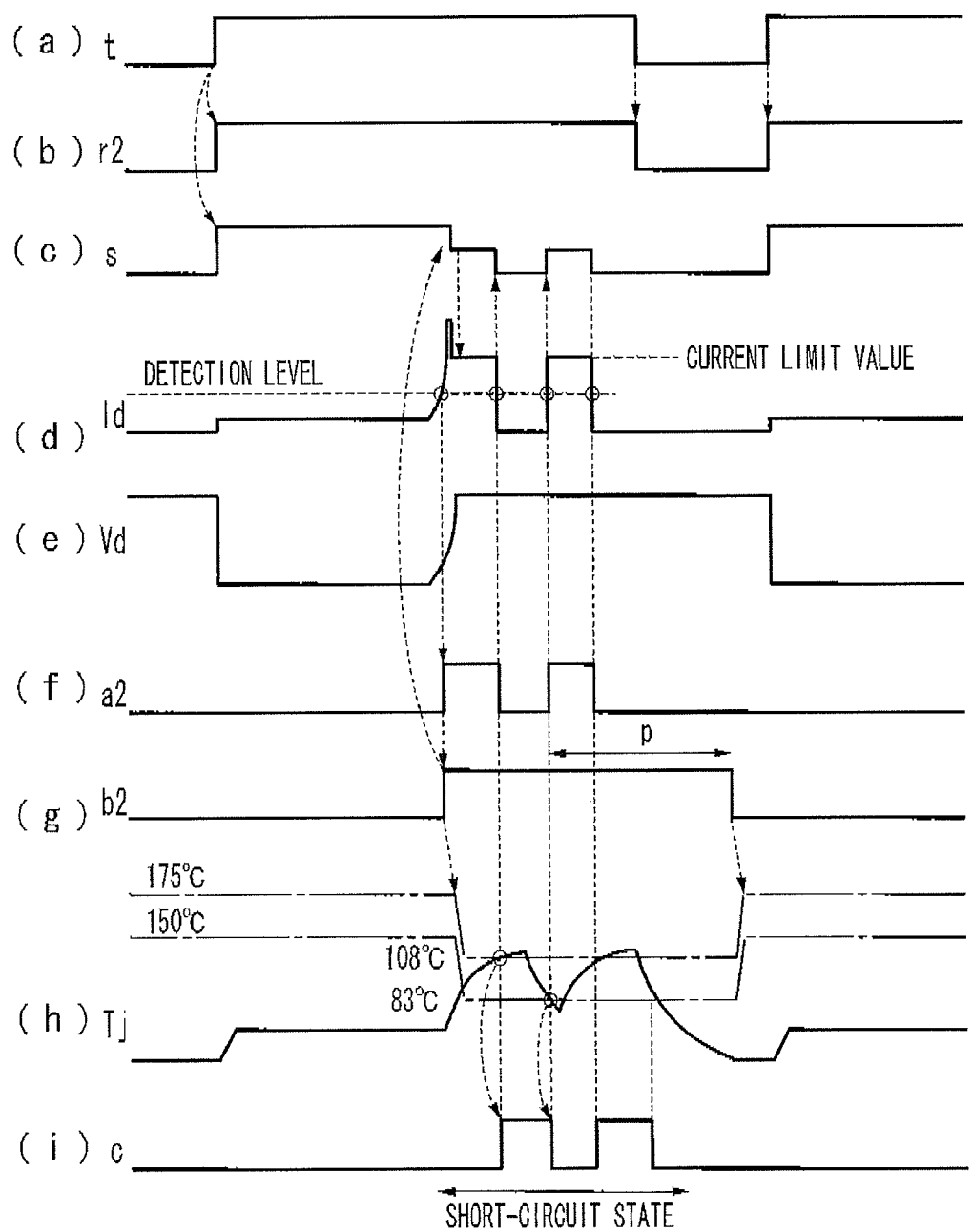
FIG. 7 is a diagram explaining another overheat detection operation of the present invention.

In the above description, the latch circuit 25 is exemplified as a circuit that is set in response to the overcurrent detection signal a2 outputted from the overcurrent detecting circuit 23 and is reset in response to the reset signal r2 outputted from the drive control circuit 31. The circuit for holding the overcurrent signal b2 is not limited to this example, and may be a circuit such as a retriggerable one-shot multivibrator for outputting a pulse having a longer time width than the thermal toggle period when the overcurrent detection signal a is given as a trigger. In this case, as shown in (g) of FIG. 7, the overcurrent latch signal b2 is set to be active (high level) when there is a next rising edge in a period for which a predetermined time p has passed from the rising edge of the overcurrent detection signal a2, and is set to be inactive (low level) in when there is not the rising edge in the period for which the predetermined time has passed. In this case, it is required to adequately set the predetermined time. The operations of the other circuits are the same as those of the first embodiment, and accordingly the descriptions are omitted.

Figure 8:
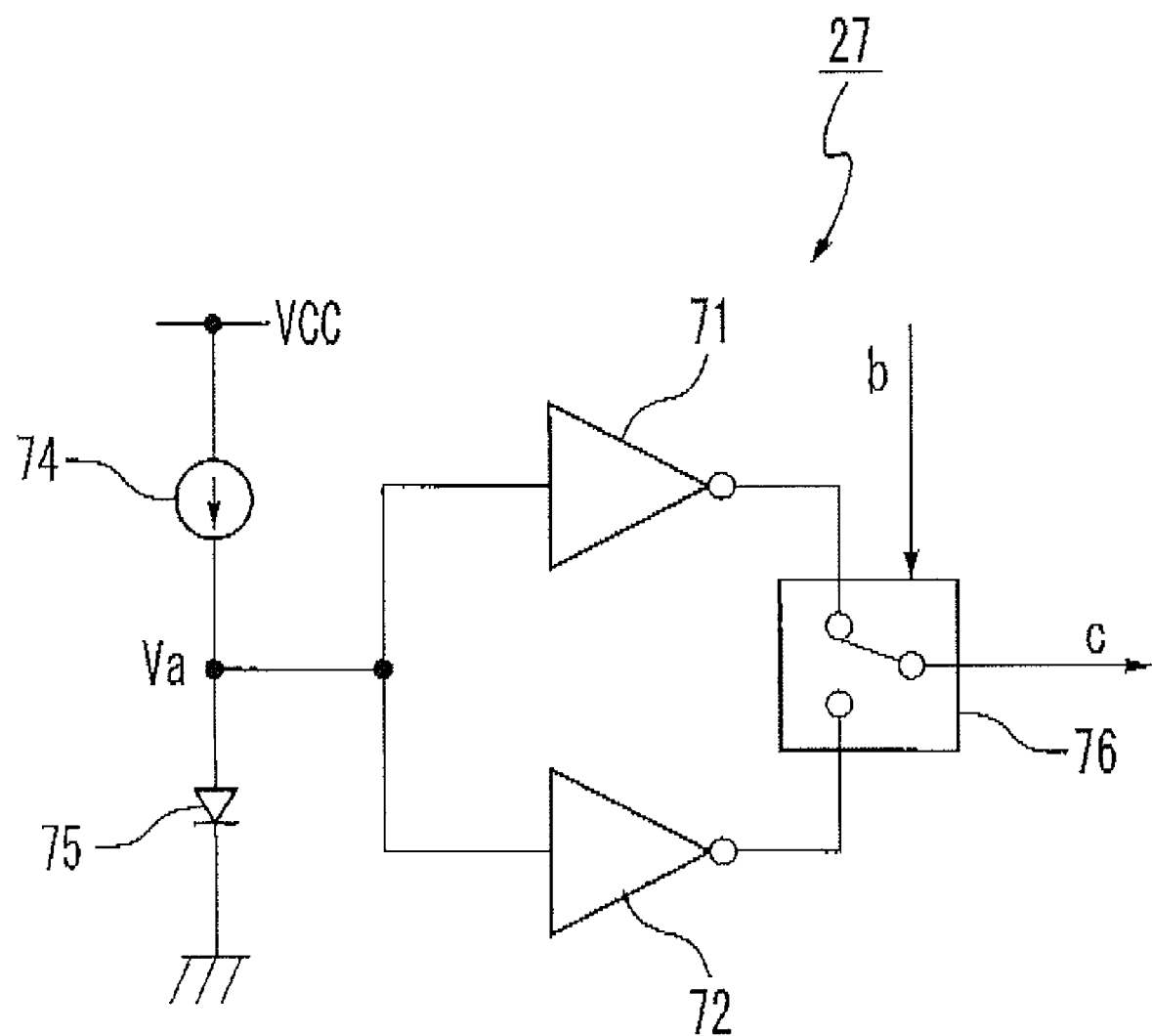
FIG. 8 is a diagram showing a configuration example of another overheat detecting circuit of the present invention.

In addition, as shown in FIG. 3, the overheat detecting circuit 27 is exemplified as the circuit for determining the overheat state by the comparator 51 by using the forward voltage of the diodes as the temperature sensor. However, as shown in FIG. 8, the inverter circuit can be used.

In this case, the overheat detecting circuit 27 includes Schmitt trigger-type inverters 71 and 72, a constant current source 74, a diode 75, and a switch 76. The forward voltage Va of the diode 75 varies clue to the constant current outputted from the constant current circuit 74 in accordance with a peripheral temperature. A voltage level of the forward voltage Va is determined by the inverters 71 and 72. The inverter 71 has hysteresis in which a rising threshold value is set to a normal overheat detection temperature (for example, 175° C.) and a falling threshold value is set to a normal recovery temperature (for example, 150° C.). The inverter 72 has hysteresis in which a rising threshold value is set to the overheat detection temperature in the overcurrent detection (for example, 108° C.) and a falling threshold value is set to the recovery temperature in the overcurrent detection (for example, 83° C.). One of the output of the inverter 71 and the output of the inverter 72 is selected by the switch 76, and is outputted as the overheat detection signal c. The switch 76 selects the output of the inverter 71 or the output of the inverter 72 in response to the overcurrent signal b.

Accordingly, in the same manner as that of the above-mentioned overheat detecting circuit 27, the overheat detecting circuit 27 having the inverter circuit can operate to switch the overheat detection temperature and the recovery temperature in the overheat detection operation having the hysteresis depending on the detection of overcurrent.

In the above-mentioned description, as a method for switching the detection temperature, a method of switching the number of diodes of the temperature sensor, and a method of switching of the reference voltage has been exemplified. However, the method may switch the bias current applied to the diodes of the temperature sensor.

As described above, according to the present invention, in the simple circuit configuration, it is able to lower the overheat detection temperature when detecting the overcurrent and to control the current supply so that the overheat state is not continued for a long period. Accordingly, a long-term reliability of a resin and a bonding wire can be attained from the overheat state. In addition, since data representing an abnormal state is stored and can be outputted arbitrarily, the abnormal state can be eliminated by replacing only the load device causing the abnormal state.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor device comprising:
    a current supply section configured to control a current flowing through a load circuit;
    an overcurrent detecting section configured to detect based on the current, that an overcurrent flows through said load circuit, to output an overcurrent signal;
    an overheat detecting circuit configured to detect that a peripheral temperature exceeds a detection target temperature, in response to said overcurrent signal, and output an overheat detection signal;
    wherein said overheat detecting circuit has a hysteresis to said detection target temperature, and said detection target temperature contains an overheat detection temperature used to detect an overheat state and a recovery temperature used to detect cancellation from said overheat state; and
    a drive control circuit configured to output the current control signal which indicates the quantity of the current flowing through said load circuit based on said overcurrent signal and said overheat detection signal in said electric current supply section.

2. The semiconductor device according to claim 1, further comprising:
    an abnormal state notifying circuit configured to notify abnormal state data based on said overcurrent signal and said overheat detection signal to indicate an abnormal state of said load circuit; and
    a control circuit comprising a memory, and configured to store said abnormal state data notified from said abnormal state notifying circuit in said memory, and output said abnormal state data in response to a request signal from outside.

3. The semiconductor device according to claim 2, wherein said overcurrent detecting section comprises:
    a signal holding circuit configured to hold an overcurrent data for a predetermined time, to indicate that the overcurrent has flowed through said load circuit,
    wherein said control circuit instructs said drive control circuit to supply the current to said load circuit,
    wherein said drive control circuit instructs said current supplying section to supply said current in response to the instruction from said control circuit, and
    wherein said signal holding circuit cancels the holding state of said overcurrent data in response to an instruction from said drive control circuit.

4. The semiconductor device according to claim 3, wherein said signal holding circuit comprises a flip-flop which is set in response to the overcurrent flowing through said load circuit and is reset in response to an instruction from said control circuit.

5. The semiconductor device according to claim 1, wherein said overcurrent detecting section comprises:
    a signal holding circuit configured to hold the overcurrent data indicating that the overcurrent has flowed through said load circuit for a predetermined time, and
    wherein said signal holding circuit cancels the holding state of said overcurrent data after the predetermined time from when said overcurrent detecting section detects said overcurrent.

6. The semiconductor device according to claim 5, wherein said signal holding circuit comprises a retriggerable one-shot multivibrator configured to set a period during which said overcurrent data is held, in response to the overcurrent flowing through said load circuit.

7. The semiconductor device according to claim 1, wherein said overcurrent detecting section comprises:
    a detection period setting circuit configured to set a period for which an overcurrent data is outputted by detecting that the overcurrent flows through said load circuit, and
    wherein said detection period setting circuit sets said period based on an instruction from said drive control circuit.

8. The semiconductor device according to claim 7, wherein said detection period setting circuit comprises:
    a logical product circuit configured to calculate a logical product of a signal indicating the detection of the overcurrent flowing through said load circuit and a reset signal outputted from said drive control circuit.

9. The semiconductor device according to claim 1, wherein said overheat detecting circuit comprises:
    a temperature sensor circuit, a plurality of resistance elements, and a comparing circuit,
    wherein said comparing circuit compares a reference voltage generated by said plurality of resistance elements and a sense voltage outputted from said temperature sensor circuit, and outputs said overheat detection signal based on the comparing result, and wherein said reference voltage is changed by changing a combination of said plurality of resistance elements based on said overheat detection signal so as to form a hysteresis in said detection target temperature.

10. The semiconductor device according to claim 9, wherein said temperature sensor circuit comprises a plurality of diodes, and said detection target temperature is set by using a temperature characteristic of forward current of each of said plurality of diodes.

11. The semiconductor device according to claim 10, wherein said detection target temperature is set by changing the number of diodes connected in series.

12. The semiconductor device according to claim 10, wherein said detection target temperature is set by changing a current flowing through said diodes.

13. The semiconductor device according to claim 1, wherein said overheat detecting circuit comprises:
 a plurality of inverters; and
 a selector circuit configured to select one of outputs of said plurality of inverters,
 wherein said detection target temperature is set by adjusting a threshold of each of said plurality of inverters, and
 wherein said selector circuit changes said detection target temperature by selecting said one inverter in response to an overcurrent latch signal.

14. An engine control unit comprising said semiconductor device which comprises:
 a current supply section configured to control a current flowing through a load circuit;
 an overcurrent detecting section configured to detect based on the current, that an overcurrent flows through said load circuit, to output an overcurrent signal;
 an overheat detecting circuit configured to detect that a peripheral temperature exceeds a detection target temperature, in response to said overcurrent signal, and output an overheat detection signal;
 wherein said overheat detecting circuit has a hysteresis to said detection target temperature, and said detection target temperature contains an overheat detection temperature used to detect an overheat state and a recovery temperature used to detect cancellation from said overheat state; and
 a drive control circuit configured to output the current control signal which indicates the quantity of the current flowing through said load circuit based on said overcurrent signal and said overheat detection signal in said electric current supply section.

15. A circuit protection method comprising:
 detecting an overcurrent flowing through a load circuit;
 detecting an overheat state in which a peripheral temperature exceeds a detection target temperature;
 changing said detection target temperature from a first detection temperature to a second detection temperature which is lower than said first detection temperature, for a predetermined time period after the detection of said overcurrent;
 wherein when it is detected that said peripheral temperature exceeds said detection target temperature, said first detection temperature is set to a first recovery temperature and said second detection temperature is set to a second recovery temperature;
 wherein when it is detected that said peripheral temperature falls lower than said detection target temperature, said first detection temperature is set to a first overheat temperature which is higher than said first recovery temperature and said second detection temperature is set to a second overheat temperature which is higher than said second recovery temperature; and
 controlling a value of said current flowing through said load circuit based on the detection of overheat and the detection of overcurrent.

16. The circuit protection method according to claim 15, further comprising:
 notifying an abnormal state data based on the detection of said overheat and the detection of said overcurrent to indicate an abnormal state of said load circuit;
 storing said abnormal state data in a memory; and
 outputting said abnormal state data stored in said memory, in response to a request from outside.

17. The circuit protection method according to claim 15, wherein detecting an overcurrent comprises holding the detection state of said overcurrent, and
 said detection target temperature is changed for a period during which the detection state of said overcurrent is held.

* * * * *